(12) United States Patent
Parris et al.

(10) Patent No.: US 6,738,302 B1
(45) Date of Patent: May 18, 2004

(54) OPTIMIZED READ DATA AMPLIFIER AND METHOD FOR OPERATING THE SAME IN CONJUNCTION WITH INTEGRATED CIRCUIT DEVICES INCORPORATING MEMORY ARRAYS

(75) Inventors: Michael C. Parris, Colorado Springs, CO (US); Kim C. Hardee, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/360,146

(22) Filed: Feb. 7, 2003

(51) Int. Cl.[7] .................................................. G11C 7/06
(52) U.S. Cl. ........................ 365/208; 365/205; 327/52; 327/53
(58) Field of Search ................................ 365/205, 207, 365/208; 327/52, 53, 55

(56) References Cited

U.S. PATENT DOCUMENTS

| | | | |
|---|---|---|---|
| 4,751,681 A | * | 6/1988 | Hashimoto ............ 365/189.05 |
| 4,766,333 A | | 8/1988 | Mobley |
| 5,663,915 A | | 9/1997 | Mobley |
| 6,137,319 A | * | 10/2000 | Krishnamurthy et al. ..... 327/51 |
| 6,590,428 B2 | * | 7/2003 | Barnes ......................... 327/65 |

* cited by examiner

Primary Examiner—Son Mai
(74) Attorney, Agent, or Firm—William J. Kubida; Hogan & Hartson LLP (57) ABSTRACT

An optimized read data amplifier for the output data path of integrated circuit memory arrays comprises a fast, low power and small on-chip area consuming circuit which is advantageously effectuated through the combined application of "current sensing" and "voltage sensing" techniques. In a particular embodiment disclosed herein, an amplifier enable signal is timed with the column read address so that the amplifier is turned "off" when not in use and both data read lines ("DR" and "DRB") are precharged "high". No clocking of the read data amplifier is required in order to obviate undesired clock latencies and pipelining and a simple mechanism is implemented such that control of power-up and power-down results in further power savings.

25 Claims, 5 Drawing Sheets

OPTIMIZED READ DATA AMPLIFIER AND METHOD FOR OPERATING THE SAME IN CONJUNCTION WITH INTEGRATED CIRCUIT DEVICES INCORPORATING MEMORY ARRAYS

CROSS REFERENCE TO RELATED PATENT APPLICATIONS

The present invention is related to the subject matter disclosed in U.S. patent application Ser. No. 10/345,735 filed on Jan. 16, 2003 for: "Reduced Gate Delay Multiplexed Interface and Output Buffer Circuit for Integrated Circuit Devices Incorporating Random Access Memory Arrays", and assigned to the assignee of the present invention, the disclosure of which is herein specifically incorporated by this reference.

BACKGROUND OF THE INVENTION

The present invention relates, in general, to the field of integrated circuit ("IC") devices incorporating memory arrays. More particularly, the present invention relates to an optimized read data amplifier and method for operating the same for use in the output data path of integrated circuit memory arrays.

Many types of dynamic random access memory ("DRAM") based devices, or integrated circuits including embedded memory arrays, are currently available including extended data out ("EDO"), synchronous DRAM ("SDRAM"), double data rate ("DDR") DRAM and the like. Regardless of configuration, the primary purpose of the DRAM is to store data. Functionally, data may be written to the memory, read from it or periodically refreshed to maintain the integrity of the stored data. In current high density designs, each DRAM memory cell comprises a single pass transistor coupled to an associated capacitor that may be charged to store a value representative of either a logic level "1" or "0". Data stored in these memory cells may be read out and written to them through columns of sense amplifiers coupled to complementary bit lines interconnecting rows of these cells.

Historically, integrated circuit differential amplifiers for use in reading out the contents of memory arrays have consumed a relatively large amount of power and a large amount of on-chip silicon area. For most conventional DRAM products with input/output ("I/O") widths of four, eight or sixteen bits, these deficiencies can be minimized. However, for advanced embedded DRAM products containing typical I/O widths of 128 bits or more (wherein each bit of the I/O width requires a read amplifier and more if pre-fetching is being employed) the deficiencies severely limit the performance and cell efficiency of the DRAM.

SUMMARY OF THE INVENTION

Disclosed herein is a fast, low power and small on-chip area consuming read data amplifier which is advantageously effectuated through the combined application of "current sensing" and "voltage sensing" techniques. In a particular embodiment disclosed herein, an amplifier enable signal is timed with the column read address so that the amplifier is turned "off" when not in use and both data read lines ("DR" and "DRB") are precharged "high". No clocking of the read data amplifier is required in order to obviate undesired clock latencies and pipelining and a simple mechanism is implemented such that control of power-up and power-down results in further power savings.

Particularly disclosed herein is an integrated circuit device including a read data amplifier coupled to first and second complementary read data lines and an intermediate data output. The read data amplifier comprises first upper and lower series connected transistors defining a first circuit node therebetween for coupling the first of the complementary read data lines to a tail node. Second upper and lower series connected transistors define a second circuit node therebetween to form the intermediate data output and couple the second of the complementary read data lines to the tail node. Control terminals of the first and second upper transistors are coupled to the first circuit node while a control terminal of the second lower transistor is coupled to the first data read line and a control terminal of the first lower transistor is coupled to the second data read line. A tail transistor couples the tail node to a first voltage source and first and second precharge transistors respectively couple the first and second circuit nodes to a second voltage source. First and second pull up transistors respectively couple the first and second complementary read data lines to the second voltage source and an enable input is coupled to a control terminal of the tail transistor and the first and second precharge transistors for enabling the read data amplifier.

Further disclosed herein is a read data amplifier coupling first and second data read lines to an output node for use in an integrated circuit device incorporating a memory array. The read data amplifier comprises a differential amplifier having first and second circuit nodes and first and second inputs thereof with the first input being coupled to the second data read line and the second input being coupled to the first data read line. An enable transistor is operative in response to a first state of an enable signal input for coupling the differential amplifier to a first voltage source and first and second precharge transistors are operative in response to a second opposite state of the enable signal for coupling the first and second circuit nodes respectively to a second voltage source.

Still further disclosed herein is a method for operating a read data amplifier coupled to first and second complementary data read lines in an integrated circuit device comprising a memory array. The method comprises precharging the first and second complementary data read lines and first and second circuit nodes of the read data amplifier to a first voltage level in response to a first state of an enable signal and terminating the precharge operation, applying data to the first and second complementary read data lines and substantially concurrently causing the first and second circuit nodes to assume a state corresponding to that of the first and second complementary read data lines in response to a second opposite state of the enable signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
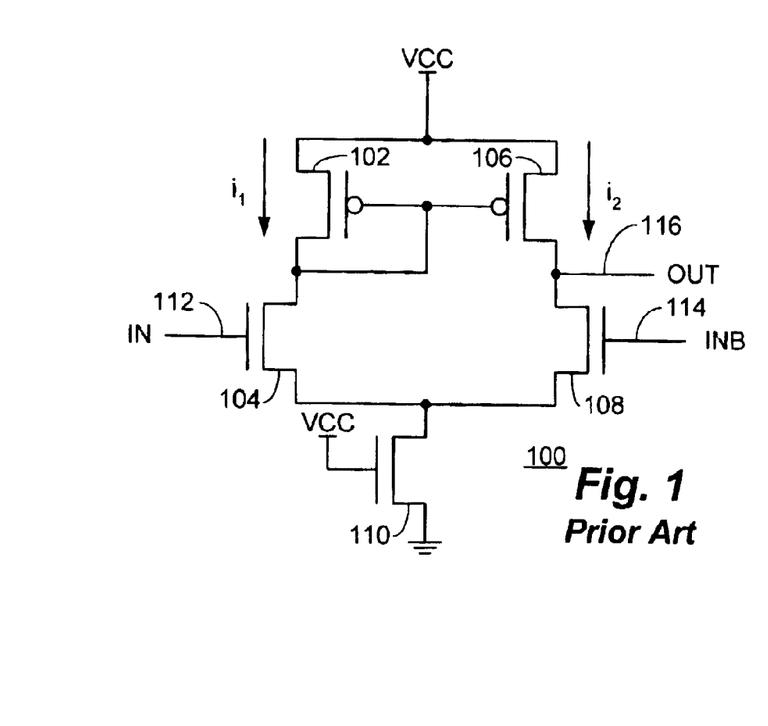
FIG. 1 is a schematic illustration of an embodiment of a conventional voltage differential amplifier ("diff amp")

With reference now to FIG. 1, a schematic illustration of an embodiment of a conventional voltage differential amplifier 100 is shown. The differential amplifier 100 comprises a P-channel transistor 102 coupled in series with an N-channel transistor 104. Another P-channel transistor 106 is coupled in series with another N-channel transistor 108 with this second series pair in parallel with the first series pair between a supply voltage source ("VCC") and one terminal of an N-channel transistor 110. The transistor 110 has its opposite terminal coupled to a reference voltage level ("VSS" or circuit ground) and its gate terminal coupled to VCC.

The gate terminals of transistors 102 and 106 are connected together at the node intermediate transistors 102 and 104 while the gate terminal of transistor 104 defines an IN input 112 and the gate terminal of transistor 108 defines an INB (the complement of the IN signal, IN Bar) input 114. The node intermediate transistors 106 and 108 defines an output ("OUT") 116 of the differential amplifier 100.

With respect to the differential amplifier shown in this figure, transistors 102 and 106 are configured such that the current $i_1$ is equal to $i_2$. The transistors 104, 108 and 110 are sized so that transistors 104 and 108 are in saturation in order that a small change in the gate-to-source voltage ("$V_{GS}$") of transistor 104 versus that of transistor 108 results in a relatively large change in the drain-to-source voltage ("$V_{DS}$") to ensure that $i_1=i_2$. This large change in $V_{DS}$ on transistor 108 shows up on the OUT line 116 as a larger voltage change and is then the gain of the differential amplifier 100.

Figure 2:
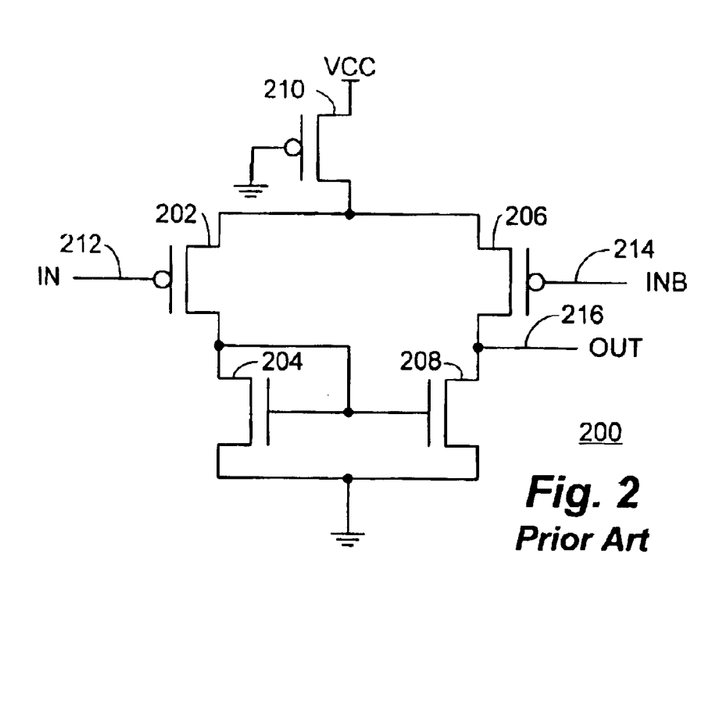
FIG. 2 is a schematic illustration of another embodiment of a conventional voltage differential amplifier.

With reference additionally now to FIG. 2, a schematic illustration of another embodiment of a conventional voltage differential amplifier 200 is shown. The differential amplifier 200 comprises a P-channel transistor 202 coupled in series with an N-channel transistor 204. Another P-channel transistor 206 is coupled in series with another N-channel transistor 208 with this second series pair in parallel with the first series pair between one terminal of an N-channel transistor 210 and circuit ground. The transistor 210 has its opposite terminal coupled to VCC and its gate terminal coupled to circuit ground.

The gate terminals of transistors 204 and 208 are connected together at the node intermediate transistors 202 and 204 while the gate terminal of transistor 202 defines an IN input 212 and the gate terminal of transistor 206 defines an INB input 214. The node intermediate transistors 206 and 208 defines an output ("OUT") 216 of the differential amplifier 200. The function of the differential amplifier 200 is similar to that of the differential amplifier 100 of the preceding figure.

Figure 3:
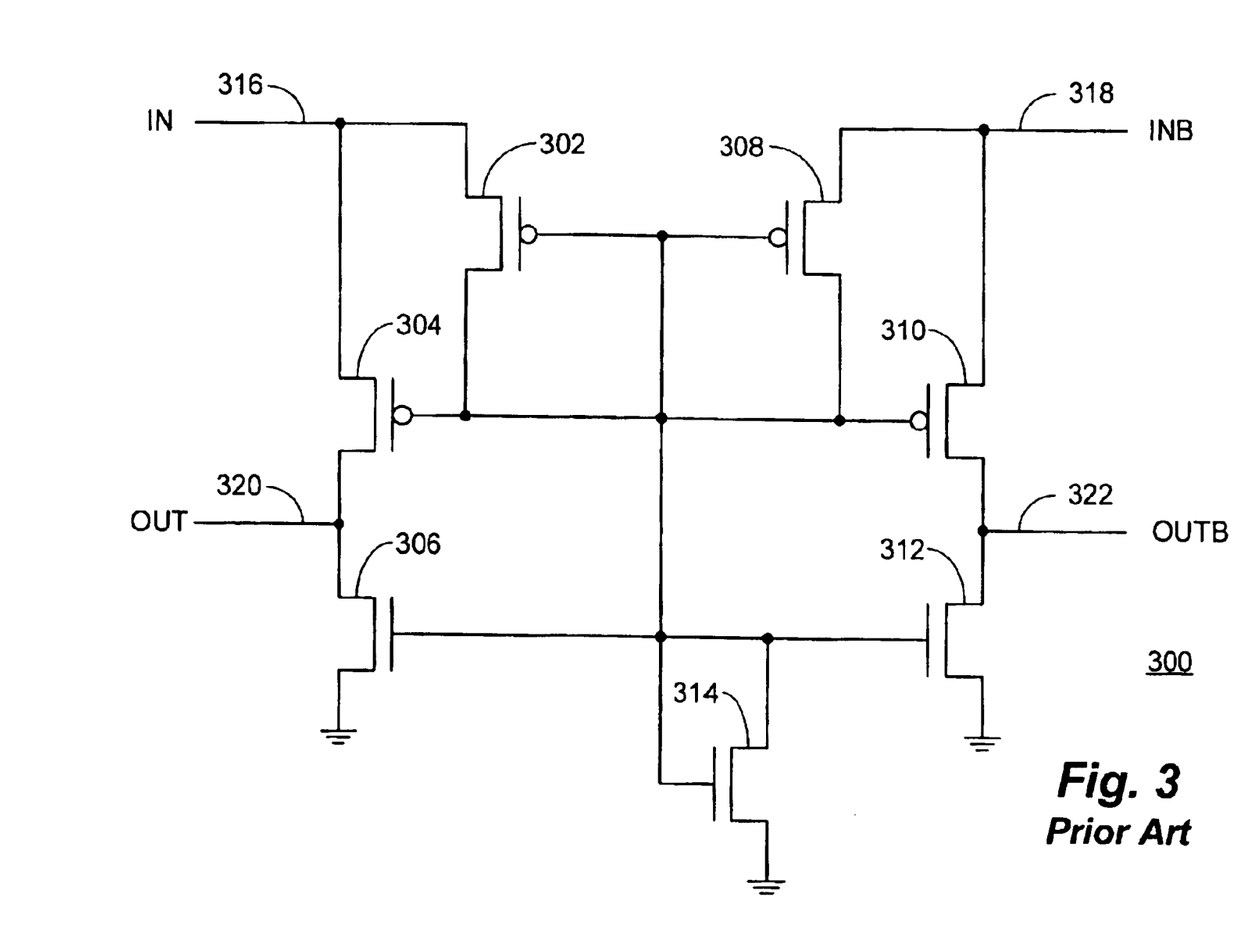
FIG. 3 is a schematic illustration of an embodiment of a first stage of a conventional output data amplifier as disclosed, for example, in U.S. Pat. No. 4,766,333.

With reference additionally now to FIG. 3, a schematic illustration of an embodiment of a first stage of a conventional output data amplifier 300 is shown as disclosed, for example, in U.S. Pat. No. 4,766,333 issuing Aug. 23, 1988 to Kenneth J. Mobley for: "Current Sensing Differential Amplifier".

The data amplifier 300 comprises a P-channel transistor 302 having one terminal thereof coupled to an IN line 316 which is also connected to one terminal of a P-channel transistor 304 which is, in turn, connected in series with an N-channel transistor 306. N-channel transistor 306 has its other terminal connected to circuit ground and the node intermediate the transistors 304 and 306 defines an OUT output line 320. The remaining terminal of transistor 302 is connected to the gate terminal of transistor 304.

The data amplifier 300 also comprises a P-channel transistor 308 having one terminal thereof coupled to an INB line 318 which is also connected to one terminal of a P-channel transistor 310 which is, in turn, connected in series with an N-channel transistor 312. N-channel transistor 312 has its other terminal connected to circuit ground and the node intermediate the transistors 310 and 312 defines a complementary OUTB output line 322. The remaining terminal of transistor 308 is connected to the gate terminal of transistor 310.

An N-channel transistor 314 is connected between the common connected gate terminals of transistors 302, 304, 306, 308, 310 and 312 and circuit ground. The gate terminal of transistor 314 is also connected to the gate terminals of all of the other transistors 302–312.

With respect to the data amplifier 300, transistors 304 and 310 are the main amplifying devices and operate in saturation. Loads on the IN and INB lines 316, 318, together with smaller transistors 302, 308, (typically one fourth the size of transistors 304 and 310) and loads due to transistors 306, 312 and 314, are all sized to maintain transistors 304 and 310 in saturation. In this manner, a small amount of change in current through transistors 304 and 310 due to the presence of signals on IN and INB lines 316, 318 will result in a large voltage difference on the OUT and OUTB lines 320, 322. Nevertheless, a few of the difficulties with the data amplifier 300 include that the amount of power it consumes and the sizes of the transistors needed to implement it are both relatively high. Further, the start-up time involved in first biasing up the data amplifier 300 can be relatively long.

Figure 4:
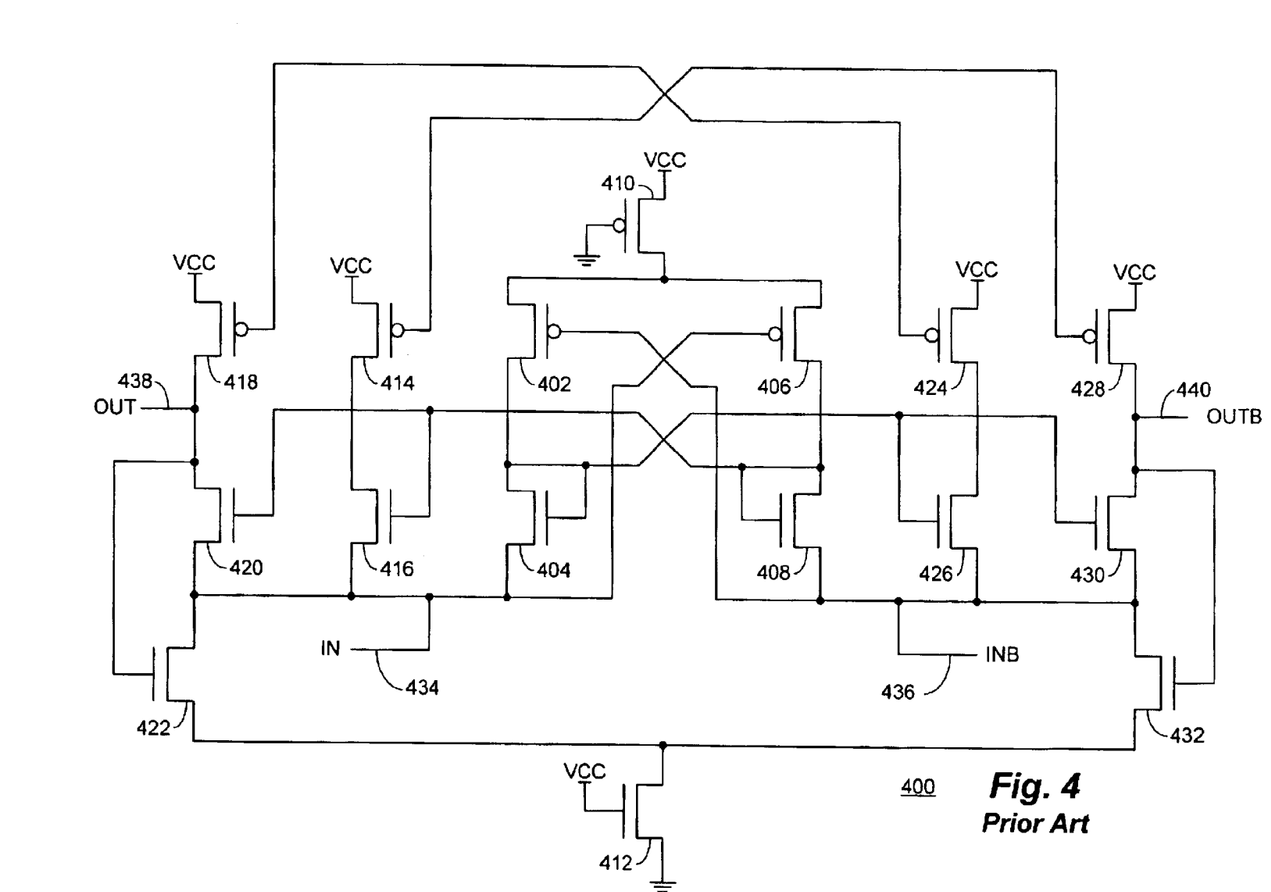
FIG. 4 is a schematic illustration of another embodiment of a first stage of a conventional output data amplifier as disclosed, for example, in U.S. Pat. No. 5,663,915.

With reference additionally now to FIG. 4, a schematic illustration of another embodiment of a first stage of a conventional output data amplifier 400 is shown as disclosed, for example, in U.S. Pat. No. 5,663,915 issuing Sep. 2, 1997 to Kenneth J. Mobley for: "Amplifier and Method for Sensing Having a Pre-Bias or Coupling Step".

The data amplifier 400 comprises a P-channel transistor 402 in series with an N-channel transistor 404. Similarly, a P-channel transistor 406 is connected in series with an N-channel transistor 408. One terminal of transistors 402 and 406 are coupled to VCC through P-channel transistor 410 which has its gate terminal coupled to circuit ground. The gate terminal of transistor 402 is coupled to an opposite terminal of transistor 408 to define an INB input 436 while the gate terminal of transistor 406 is coupled to an opposite terminal of transistor 404 to define an IN input 434. The gate terminal of transistor 404 is connected to the node intermediate transistor 404 and transistor 402 while the gate terminal of transistor 408 is connected to the node intermediate transistor 408 and transistor 406.

A P-channel transistor 414 is connected in series with an N-channel transistor 416 between VCC and the IN input 434. In like manner, a P-channel transistor 418 is connected in series with an N-channel transistor 420 between VCC and the IN input 434. The node intermediate transistors 418 and 420 defines an OUT output 438 which is also connected to the gate terminal of an N-channel transistor 422 which couples the IN input 434 to one terminal of an N-channel transistor 412. The opposite terminal of transistor 412 is connected to circuit ground while its gate terminal is connected to VCC.

Similarly, a P-channel transistor 424 is connected in series with an N-channel transistor 426 between VCC and the INB input 436. In like manner, a P-channel transistor 428 is connected in series with an N-channel transistor 430 between VCC and the INB input 436. The node intermediate transistors 428 and 430 defines an OUTB output 440 which is also connected to the gate terminal of an N-channel transistor 432 which couples the INB input 434 to one terminal of transistor 412. The gate terminal of transistor 418 is connected to the gate terminal of transistor 424 while the gate terminal of transistor 414 is connected to the gate terminal of transistor 428. The gate terminals of transistors 420 and 416 are connected to the gate terminal of transistor 408 while the gate terminals of transistors 426 and 430 are connected to the gate terminal of transistor 404.

Functionally, the data amplifier 400 constitutes an improvement over the data amplifier 300 of the preceding figure. Similar current sensing main transistors 420 and 430 operate in saturation in conjunction with biasing transistors 416, 426 and load transistors 418 and 428. Negative feedback transistors 422, 432 (which are relatively weak) are added to prevent the IN and INB inputs 434,436 from moving too far and thereby increasing the speed for "read", "read-type" functions or sense amplifier recovery operations. Transistors 414, 424, 404 and 408 constitute additional biasing transistors used to increase the stability of the data amplifier 400 and to allow for increased flexibility in its ability to "self-bias". They also serve to help with low power supply operation. Transistors 402 and 406 have been added as voltage sensing transistors, also improving the operational speed of the data amplifier 400. Tail transistor 412 also serves to provide the desired bias point and its gate can also function as an enable input.

Figure 5:
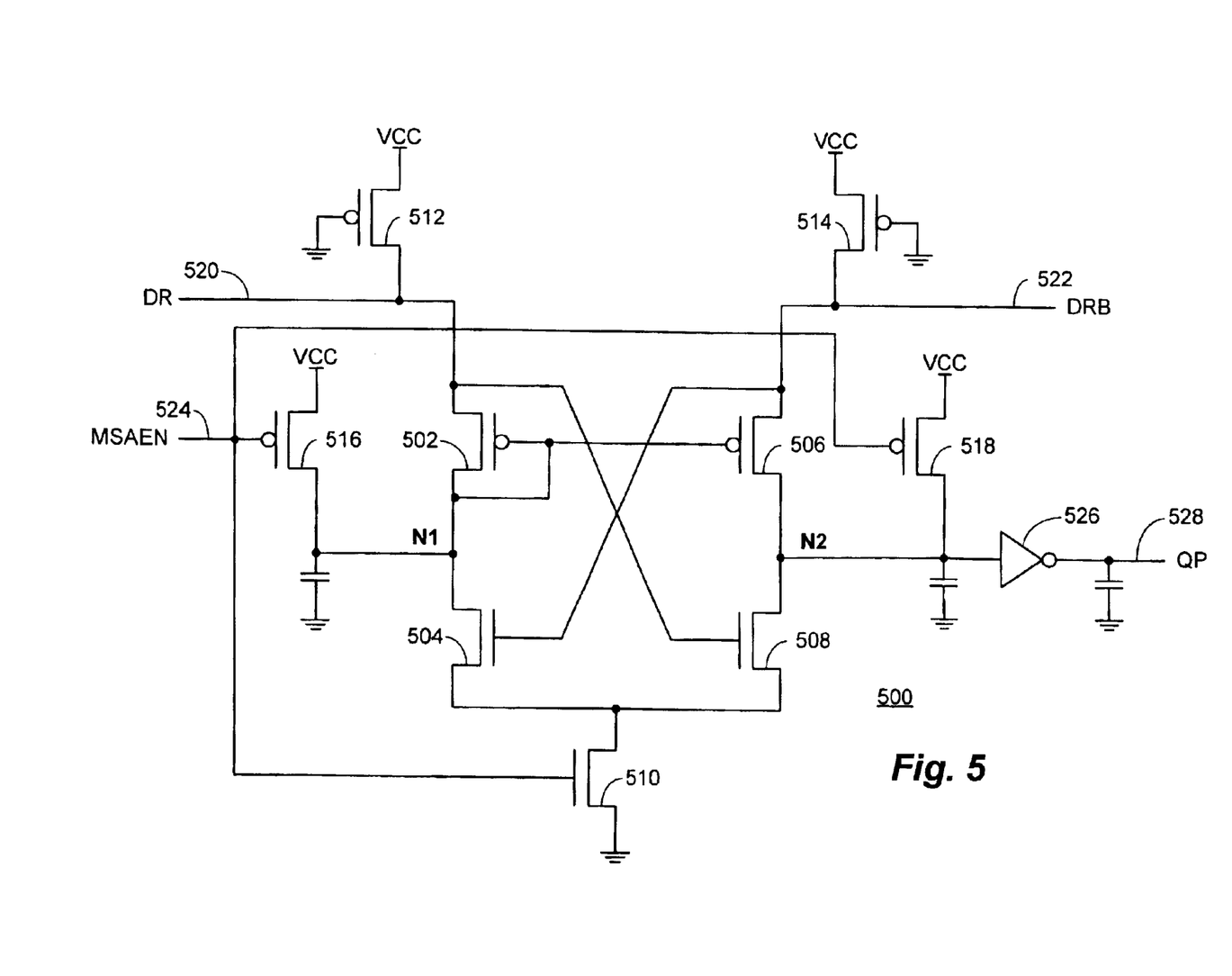
FIG. 5 is a schematic illustration of an embodiment of a main sense amplifier (read data amplifier) in accordance with the present invention illustrating the main sense amplifier enable ("MSAEN") that, for example, may be "high" during read cycles and "low" during standby or write cycles.

With reference additionally now to FIG. 5, a schematic illustration of an embodiment of a main sense amplifier 500 (read data amplifier) in accordance with the present invention is shown. The sense amplifier 500 comprises a P-channel transistor 502 coupled in series with an N-channel transistor 504 between a data read ("DR") line 520 and one terminal (i.e. a tail node) of an N-channel enable transistor 510 which has its opposite terminal coupled to circuit ground and its gate terminal coupled to receive an enable signal (e.g. the main sense amplifier enable "MSAEN" signal) on line 524. A P-channel transistor 512 is coupled between VCC and the DR line 520 and has its gate terminal coupled to circuit ground.

Similarly, a P-channel transistor 506 is coupled in series with an N-channel transistor 508 between a data read bar ("DRB") line 522 and the tail node at one terminal of the transistor 510. A P-channel transistor 514 is coupled between VCC and the DRB line 522 and has its gate terminal coupled to circuit ground. A P-channel transistor 516 is coupled between VCC and the node intermediate transistors 502 and 504 (node N1). The gate terminal of transistor 516 is coupled to the MSAEN line 524. A parasitic capacitance is indicated between node N1 and circuit ground.

In like manner, a P-channel transistor 518 is coupled between VCC and the node intermediate transistors 506 and 508 (node N2). The gate terminal of transistor 518 is also coupled to the MSAEN line 524. A parasitic capacitance is again indicated between the node N2 and circuit ground. The node N2 is coupled to the input of an inverter 526, the output of which is coupled to the data output prime ("QP") line 528 which also has a parasitic capacitance indicated between it and circuit ground.

The main sense amplifier 500 improves upon the data amplifiers 300 and 400 of the preceding FIGS. 3 and 4 respectively and provides enhancements in operating speed while consuming less on-chip area to implement. Operationally, the MSAEN signal on line 524 is an enable signal which is "high" during "read" cycles and "low" during standby or "write" cycles when the main sense amplifier 500 is not being used. When the MSAEN signal on line 524 is "low", no current flows through the main sense amplifier 500 and nodes Ni and N2 are precharged "high". During this time, the inputs DR and DRB on lines 520 and 522 respectively are also precharged "high" through transistors 502 and 506, in part, and then completely through transistors 512 and 514.

In the embodiment of the present invention illustrated, the turning on of the main sense amplifier 500, through the signal MSAEN going "high", is synchronized with the column address signals for reading as will be more fully described hereinafter. In operation, when signal appears on the DR and DRB lines 520, 522, tail transistor 510 is "on" and precharging transistors 516 and 518 are turned "off". At this point, transistor 506 performs current sensing with transistor 502 serving as a reference to generate the gate voltage for transistor 506 such that it operates in saturation. A small difference in current through transistor 506 will then provide a large difference in $V_{DS}$ or the voltage at node N2. Concurrently, the cross-coupled transistors 504 and 508 are acting as voltage sensing transistors to pull down node N1 or N2. Through this action, sufficient signal is developed on node N2 so that the next stage can be a single inverter (e.g. a complementary metal oxide semiconductor "CMOS" inverter such as inverter 526). In a preferred embodiment, the inverter 526 can be-sized to have a P-channel device to N-channel device size ratio of approximately 3:1 instead of the more typical 2:1 sizing since node N2 will not go to circuit ground completely.

Figure 6:
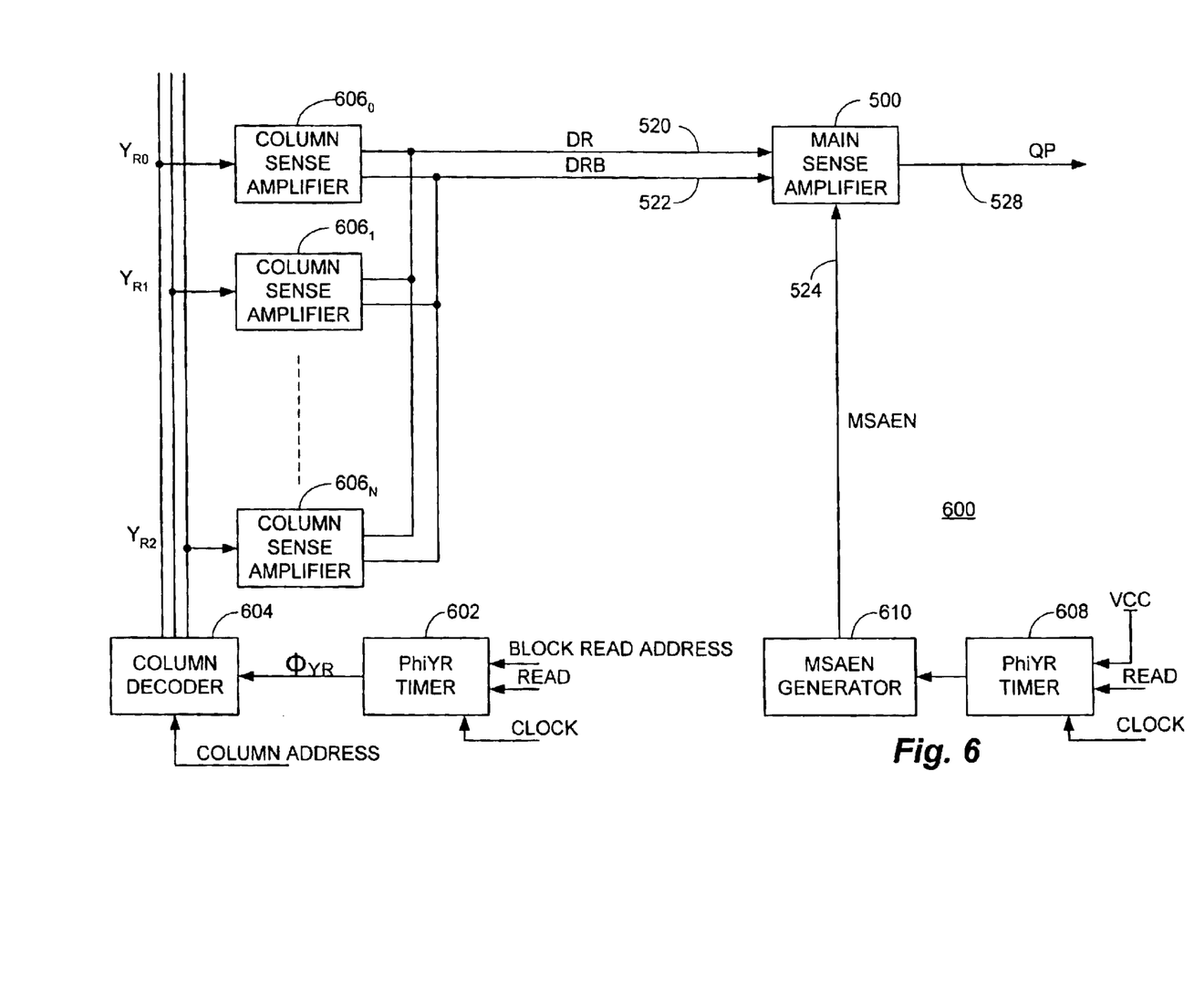
FIG. 6 is a functional block diagram of an integrated circuit device incorporating an embedded memory array implemented utilizing the main sense amplifier of the preceding figure.

With reference additionally now to FIG. 6, a functional block diagram of an integrated circuit device incorporating an embedded memory array 600 is shown which may implement the main sense amplifier of the preceding figure. The memory array 600 comprises, in pertinent part, a PhiYR timer 602 which receives an input clock signal as well as block read address and read signals as shown. The PhiYR timer outputs a $\Phi_{YR}$ signal to a column decoder 604 which also receives a column address signal.

A number of column lines $Y_{R0}$ through $Y_{R2}$ are coupled to column sense amplifiers $606_0$ through $606_N$, each of which is coupled to the complementary data read ("DR") and data read bar ("DRB") lines 520 and 522 respectively. These lines are, as indicated in the preceding figure, provided as input to the main sense amplifier 500. A PhiYR timer 608 is coupled to VCC and to receive read and clock signals to control the main sense amplifier enable generator 610 which provides the MSAEN signal on line 524 to the main sense amplifier 500. The main sense amplifier 500 provides a data output prime signal on line 528 as shown.

In operation, the DR and DRB lines 520, 522 are precharged "high" and the selected column sense amplifier 606 pulls either the DR line 520 or the DRB line 522 "low" against the transistor 512, 514 (FIG. 5) "lows". In an alternative embodiment of the present invention wherein the DR/DRB line 520, 522 driving circuit actively pulls up on one side, the principles of the present invention can still be utilized with the use of P-channel and N-channel devices (and appropriate power supply voltages) interchanged.

While there have been described above the principles of the present invention in conjunction with specific circuit elements and device technology, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. An integrated circuit device including a read data amplifier coupled to first and second complementary read data lines and an intermediate data output, the read data amplifier comprising:

first upper and lower series connected transistors defining a first circuit node therebetween coupling said first of said complementary read data lines to a tail node;

second upper and lower series connected transistors defining a second circuit node therebetween to form said intermediate data output and coupling said second of said complementary read data lines to said tail node, control terminals of said first and second upper transistors being coupled to said first circuit node, a control terminal of said second lower transistor being coupled to said first data read line and a control terminal of said first lower transistor being coupled to said second data read line;

a tail transistor coupling said tail node to a first voltage source;

first and second precharge transistors respectively coupling said first and second circuit nodes to a second voltage source;

first and second pull up transistors respectively coupling said first and second complementary read data lines to said second voltage source; and an enable input coupled to a control terminal of said tail transistor and said first and second precharge transistors for enabling said read data amplifier.

2. The integrated circuit device of claim 1 further comprising:

an inverter coupling said intermediate data output to a data output line.

3. The integrated circuit device of claim 2 wherein said inverter comprises a series connected P-channel and N-channel transistor.

4. The integrated circuit device of claim 3 wherein said P-channel transistor is substantially three times larger than said N-channel transistor.

5. The integrated circuit device of claim 1 wherein first and second pull-up transistors comprise P-channel transistors.

6. The integrated circuit device of claim 5 wherein a control terminal of said first and second pull up transistors is coupled to said first voltage source.

7. The integrated circuit device of claim 1 wherein said first and second upper transistors comprise P-channel transistors and said first and second lower transistors comprise N-channel transistors.

8. The integrated circuit device of claim 1 wherein said first and second precharge transistors comprise P-channel transistors.

9. The integrated circuit device of claim 1 wherein said tail transistor comprises an N-channel transistor.

10. The integrated circuit device of claim 1 wherein said first voltage source comprises a reference voltage source and said second voltage source comprises a supply voltage source.

11. A read data amplifier coupling first and second data read lines to an output node for use in an integrated circuit device incorporating a memory array, said read data amplifier comprising:

a differential amplifier having first and second circuit nodes and first and second inputs thereof, said first input being coupled to said second data read line and said second input being coupled to said first data read line;

an enable transistor operative in response to a first state of an enable signal input for coupling said differential amplifier to a first voltage source; and first and second precharge transistors operative in response to a second opposite state of said enable signal for coupling said first and second circuit nodes respectively to a second voltage source.

12. The read data amplifier of claim 11 further comprising:

an inverter coupling said output node to a data output line.

13. The read data amplifier of claim 12 wherein said inverter comprises a series connected P-channel and N-channel transistor.

14. The read data amplifier of claim 13 wherein said P-channel transistor is substantially three times larger than said N-channel transistor.

15. The read data amplifier of claim 11 further comprising:

first and second pull up transistors respectively coupling said first and second data read lines to said second voltage source.

16. The read data amplifier of claim 15 wherein said first and second pull up transistors comprise P-channel transistors.

17. The read data amplifier of claim 11 wherein said differential amplifier comprises a CMOS differential amplifier.

18. The read data amplifier of claim 11 wherein said enable transistor comprises an N-channel transistor.

19. The read data amplifier of claim 11 wherein said first and second precharge transistors comprise P-channel transistors.

20. The read data amplifier of claim 11 wherein said first voltage source comprises a reference voltage source and said second voltage source comprises a supply voltage source.

21. A method for operating a read data amplifier coupled to first and second complementary data read lines in an integrated circuit device comprising a memory array, said method comprising:

precharging said first and second complementary data read lines and first and second circuit nodes of said read data amplifier to a first voltage level in response to a first state of an enable signal; and terminating said precharge of said first and second complementary data read lines and said first and second circuit nodes;

applying data to said first and second complementary read data lines and substantially concurrently causing said first and second circuit nodes to assume a state corresponding to that of said first and second complementary read data lines in response to a second opposite state of said enable signal.

22. The method of claim 21 wherein said second state of said enable signal is synchronized with a column address signal of said memory array.

23. The method of claim 21 wherein said first and second states of said enable signal are logic "low" and logic "high" signals respectively.

24. The method of claim 21 wherein said first voltage level is a supply voltage level.

25. The method of claim 21 wherein said enable signal is in said first state during write or standby operation of said memory array and in said second state during read cycles of said memory array.

* * * * *